US008722537B2

(12) United States Patent
Huang et al.

(10) Patent No.: US 8,722,537 B2
(45) Date of Patent: May 13, 2014

(54) MULTI-SACRIFICIAL LAYER AND METHOD

(75) Inventors: Yao-Te Huang, Hsin-Chu (TW); Chia-Hua Chu, Zhubei (TW); Yu-Nu Hsu, Tainan (TW); Chun-Wen Cheng, Zhubei (TW); Li-Chung Peng, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 656 days.

(21) Appl. No.: 12/686,878

(22) Filed: Jan. 13, 2010

(65) Prior Publication Data
US 2010/0240215 A1    Sep. 23, 2010

Related U.S. Application Data

(60) Provisional application No. 61/161,592, filed on Mar. 19, 2009.

(51) Int. Cl.
*H01L 21/44* (2006.01)

(52) U.S. Cl.
USPC ............................ 438/669; 438/738; 438/739

(58) Field of Classification Search
CPC ..................... B81B 7/0003; B81B 2201/0221; B81B 2203/0118; B81C 1/00007; B81C 1/00468; B81C 1/00476

USPC ......... 438/239, 381, 669, 379, 670, 738, 739; 257/E21.587

See application file for complete search history.

(56) References Cited

U.S. PATENT DOCUMENTS

| 6,229,684 B1 | 5/2001 | Cowen et al. |
| 6,404,028 B1 * | 6/2002 | Hetrick et al. ............... 257/415 |
| 6,475,929 B1 * | 11/2002 | Gabriel et al. ............... 438/783 |
| 6,909,589 B2 | 6/2005 | Huff |
| 2006/0178002 A1 * | 8/2006 | Kim et al. .................... 438/622 |
| 2007/0042524 A1 * | 2/2007 | Kogut et al. .................. 438/52 |
| 2009/0231666 A1 * | 9/2009 | Gudlavalleti et al. ......... 359/290 |

* cited by examiner

*Primary Examiner* — Khiem D Nguyen
(74) *Attorney, Agent, or Firm* — Slater and Matsil, L.L.P.

(57) ABSTRACT

MEMS devices and methods for utilizing sacrificial layers are provided. An embodiment comprises forming a first sacrificial layer and a second sacrificial layer over a substrate, wherein the second sacrificial layer acts as an adhesion layer. Once formed, the first sacrificial layer and the second sacrificial layer are patterned such that the second sacrificial layer is undercut to form a step between the first sacrificial layer and the second sacrificial layer. A top capacitor electrode is formed over the second sacrificial layer, and the first sacrificial layer and the second sacrificial layer are removed in order to free the top capacitor electrode.

20 Claims, 3 Drawing Sheets

MULTI-SACRIFICIAL LAYER AND METHOD

This application claims the benefit of U.S. Provisional Patent Application Ser. No. 61/161,592, filed on Mar. 19, 2009, and entitled "Multi-Sacrificial Layer and Method," which application is incorporated herein by reference.

TECHNICAL FIELD

The present invention relates generally to a microelectromechanical system devices and methods and, more particularly, to such devices and methods utilizing sacrificial layers.

BACKGROUND

Microelectromechanical system (MEMS) devices have been recently utilized in order to obtain devices with variable physical properties. Examples of these MEMS devices include devices with variable physical properties, such as digital micromirror devices (DMDs), and devices with variable electrical properties, such as variable capacitors or variable inductors. Generally, each of these MEMS devices comprises a moveable piece whose movement, when actuated by, e.g., an electrode, causes a change in the variable property of the device.

Generally, well-known semiconductor manufacturing techniques have been utilized to great effect in forming these moveable pieces within the MEMS devices. Using these techniques, parts which are intended to be moveable are initially manufactured as an immovable layer over a sacrificial layer such as a photoresist. Following the completion of the manufacturing of the moveable piece, the sacrificial layer is then removed, thereby freeing the moveable piece to move.

However, when using these processes the topography of the standard photoresist typically used as a sacrificial layer is limited by the fluid dynamic characteristics of the photoresist from forming a flat surface over the underlying features. Such a non-planar surface can create problems during further processing of the device.

Additionally, the use of a typical photoresist also typically uses a high temperature dry strip in order to remove the sacrificial layer. Not only may this result in a larger thermal budget for the overall process, but such a high temperature process also may affect the physical characteristics of the MEMS structure itself, creating defects within the MEMS structure. These defects can reduce the efficiency of the MEMS device itself, and may cause a complete failure of the structure in general.

SUMMARY OF THE INVENTION

These and other problems are generally solved or circumvented, and technical advantages are generally achieved, by embodiments of the present invention which provide for a multiple layer sacrificial layer.

In accordance with a embodiment of the present invention, a method for forming sacrificial layers comprises providing a substrate and forming a plurality of sacrificial layers over the substrate. The plurality of sacrificial layers are patterned such that a first sacrificial layer is removed at a faster rate than a second sacrificial layer.

In accordance with another embodiment of the present invention, a method for forming a semiconductor device comprises providing a substrate and forming a first sacrificial layer over the substrate with a first thickness. A second sacrificial layer is formed over the first sacrificial layer, the second sacrificial layer having a second thickness les than the first thickness. A blanket layer is formed over the first sacrificial layer and the second sacrificial layer, and the blanket layer is patterned such that at least a portion of the blanket layer remains over the second sacrificial layer. The first sacrificial layer and the second sacrificial layer are removed after the patterning the blanket layer.

In accordance with yet another embodiment of the present invention, a variable capacitor comprises a substrate, a bottom electrode over the substrate, and a dielectric layer over the bottom electrode. A top electrode is separated from the bottom electrode, the top electrode being attached to a torsional hinge that allows the top electrode to move relative to the dielectric layer. The top electrode also comprises a first side facing the dielectric layer and a first sidewall. The junction between the first side and the sidewall comprises a step junction.

An advantage of an embodiment of the present invention is the reduction or elimination of variations caused by the fluid dynamic characteristics of sacrificial layers as they are being applied.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of embodiments of the present invention are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, namely a multiple sacrificial layer structure for a variable capacitor MEMS device. The invention may also be applied, however, to other sacrificial structures and other types of devices.

Figure 1:
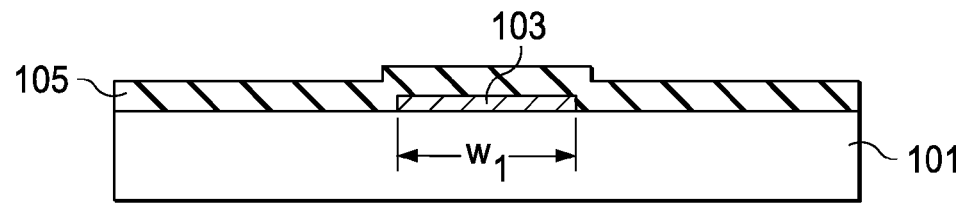
FIG. 1 illustrates a substrate with a capacitor bottom electrode and a dielectric layer over the substrate in accordance with an embodiment of the present invention.

With reference now to FIG. 1, there is shown a substrate 101 with a variable capacitor bottom plate 103 and a dielectric layer 105 over the variable capacitor bottom plate 103. The substrate 101 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof Other substrates that may be used include multi-layered substrates, gradient substrates, or hybrid orientation substrates.

The variable capacitor bottom plate 103 comprises one of the plates of a variable capacitor 600 (shown fully completed below in FIG. 6), and may comprise either an aluminum copper alloy (AlCu) or an AlCu alloy with titanium nitride (TiN). The variable capacitor bottom plate 103 may be formed by first forming a blanket layer (not shown) using a chemical vapor deposition process, such as plasma-enhanced CVD (PECVD). Once the blanket layer has been formed, a suitable masking and etching technique may be utilized to remove portions of the blanket layer to leave behind the variable capacitor bottom plate 103. However, other materials and processes of formation may alternatively be used to form the variable capacitor bottom plate 103. In an embodiment, the variable capacitor bottom plate 103 may have a width $w_1$ of between about 1 μm and about 2,000 μm, such as between about 50 μm and about 200 μm, and may have a thickness of between about 10 nm and about 2,000 nm, such as between about 500 nm and 600 nm.

The dielectric layer 105 is formed over the variable capacitor bottom plate 103 in order to protect and isolate the variable capacitor bottom plate 103 from a yet-to-be formed variable capacitor top electrode 601 (described below with respect to FIG. 6). The dielectric layer 105 may comprise silicon nitride formed through a process such as PECVD, although other suitable materials, such as silicon dioxide, and other methods of formation, such as CVD, may alternatively be used. The dielectric layer 105 may be formed to a thickness of between about 10 nm and about 2,000 nm, such as a thickness of between about 500 nm and about 600 nm.

Figure 2A:
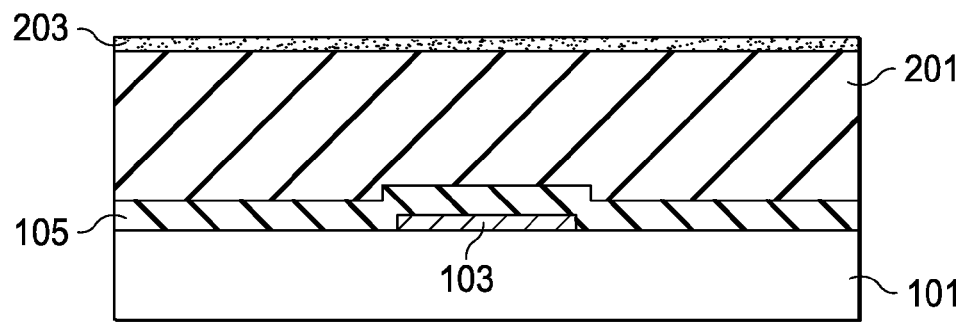
FIG. 2A illustrates a multi-layer sacrificial layer in accordance with an embodiment of the present invention.

FIG. 2 illustrates the formation of a first sacrificial layer 201 and a second sacrificial layer 203 over the first sacrificial layer 201. The first sacrificial layer 201 may comprise a suitable sacrificial material that is easily removed by a process such as an isotropic etch without removing surrounding material such as the to-be formed variable capacitor top electrode 601 (described below with respect to FIG. 6), such as amorphous carbon. However, any suitable material, such as amorphous silicon, silicon oxide, silicon nitride, AlCU, combinations of these, or the like may alternatively be used.

The first sacrificial layer 201 may be formed using a PECVD process. If amorphous carbon is utilized, the PECVD may be performed with chemical precursors such as a monosilane gas and methane. However, any suitable method and other suitable precursors (depending upon the precise materials chosen), may be used to form the first sacrificial layer 201. The first sacrificial layer 201 may be formed to have a thickness over the variable capacitor bottom plate 103 of between about 10 nm and about 10 μm, such as a thickness of between about 3 μm and about 5 μm.

The second sacrificial layer 203 is formed over the first sacrificial layer 201, and is intended to act as an adhesion layer between the first sacrificial layer 201 and the to-be formed variable capacitor top electrode 601 (discussed below with respect to FIG. 6). The second sacrificial layer 203 may be formed using a PECVD process to form a material with adhesive properties. Such materials may include suitable bottom anti-reflective coatings (BARC) materials (e.g., titanium nitride, silicon oxynitride, silicon nitride, or other absorber-type polymer film, combinations of these, or the like), or materials used as photoresists, such as a photosensitive polyimide or the like. However, other materials and processes may alternatively be used to form the second sacrificial layer 203.

Because the second sacrificial layer 203 is used for adhesion, the second sacrificial layer 203 is formed to a thickness that is less than the first sacrificial layer 201. For example, if the first sacrificial layer 201 is formed to a thickness of about 0.5 μm, the first sacrificial layer 201 may be formed to a thickness of less than about 0.5 μm.

Optionally, a surface treatment may be performed on the second sacrificial layer 203 in order to promote adhesion with later formed layers. The surface treatment may be either a chemical treatment, such as application of an alkylsilane in order to turn the surface of the second sacrificial layer 203 hydrophobic, or else a physical treatment, such as plasma etching or corona etching. However, any suitable form of surface treatment may be applied to the second sacrificial layer in order to promote adhesion.

Figure 2B:
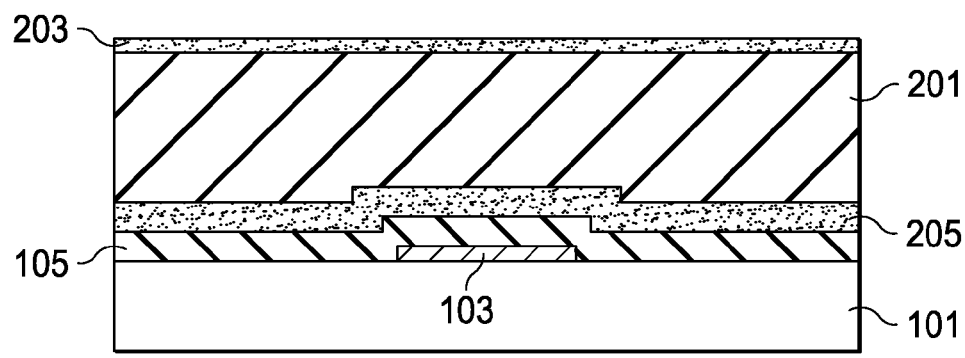
FIG. 2B illustrates a multi-layer sacrificial layer with three sacrificial layers in accordance with an embodiment of the present invention.

FIG. 2B illustrates another embodiment that includes a third sacrificial layer 205 between the first sacrificial layer 201 and the dielectric layer 105. The third sacrificial layer 205 acts as an adhesion layer, similar to the second sacrificial layer, and may comprise a material similar to the materials that may be used for the second sacrificial layer 203. The third sacrificial layer 205 may be formed using a similar process as the process used to form the second sacrificial layer 203, and may have a thickness less than the thickness of the first sacrificial layer 201. As such, while the exact thickness of the third sacrificial layer 205 is at least partially dependent upon the thickness of the first sacrificial layer 201, the third sacrificial layer 205 may have a thickness of between about 10 nm and about 1 μm, such as a thickness of between about 50 nm and about 100 nm.

However, as one of ordinary skill in the art will recognize, while an embodiment having two sacrificial layers and an embodiment having three sacrificial layers have been disclosed herein, these embodiments are meant to be illustrative only, and are not meant to limit the scope of the invention in any manner. As such, any number of sacrificial layers may be ordered in any number of ways over the dielectric layer 105. All of these combinations are fully intended to be included within the scope of the present invention.

Figure 3:
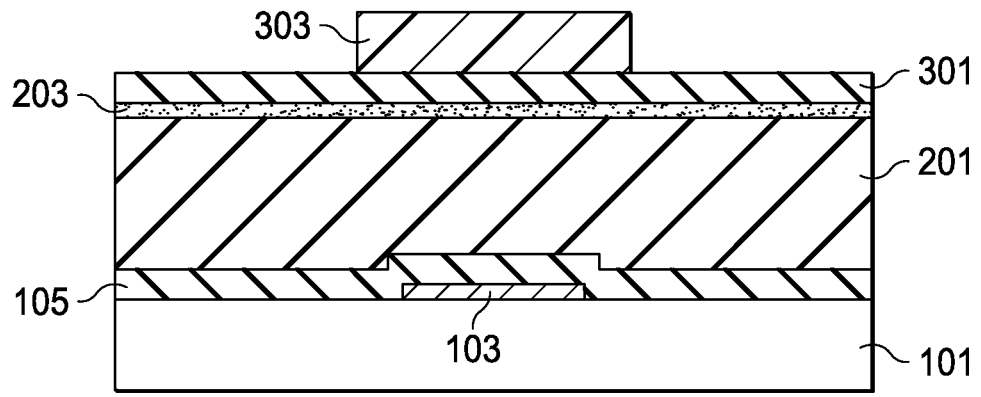
FIG. 3 illustrates the formation of a hardmask over the sacrificial layer in accordance with an embodiment of the present invention.

FIG. 3 illustrates the formation and patterning of a hardmask 301 over the second sacrificial layer 203. The hardmask 301 is used to pattern the underlying first sacrificial layer 201 and the second sacrificial layer 203 by protecting those portions of the first sacrificial layer 201 and the second sacrificial layer 203 layers that are desired to be maintained. The hardmask 301 may be formed of silicon dioxide, although other suitable materials, such as silicon nitride or an aluminum copper alloy, may also be utilized, as long as the hardmask has a different etch selectivity than the materials of the first sacrificial layer 201 and the second sacrificial layer 203. The hardmask 301 may be formed using a PECVD process, although any suitable process of formation known in the art may alternatively be used and may be formed to have a thickness of less than about 1 μm, such as about 100 nm.

FIG. 3 also illustrates the formation and patterning of a photoresist 303 over the hardmask 301. The photoresist 303 will be used to pattern the hardmask 301 and may comprise a positive-type, alkaline developable photoresist such as a polyimide. However, any suitable type of photoresistive materials may alternatively be used in order to pattern the hardmask 301.

The photoresist 303 may be applied to the hardmask 301 while the photoresist 303 is in a liquid state using a spin-on process. However, other methods of application, such as CVD, may alternatively be used. Additionally, the photoresist 303 may be formed such that the photoresist 303 has a thickness that is less than the combined thickness of the first sacrificial layer 201 and the second sacrificial layer 203. As such, the photoresist 303 may be removed either in a separate removal process (as described further below with respect to FIG. 3) or else removed during a patterning of the first sacrificial layer 201 and the second sacrificial layer 203 (described below with respect to FIG. 4), thereby eliminating the need for a separate removal step.

Once applied, the photoresist 303 is exposed to a light pattern in order to chemically alter the illuminated portions of the photoresist 303. After being exposed, the photoresist 303 is developed and unexposed portions of the photoresist 303 are removed in order to expose those portions of the hardmask 301 that are desired to be removed.

These exposed portions of the hardmask 301 may be removed through an etching process using the photoresist 303 as a mask. The hardmask 301 may be patterned using an anisotropic etch process using etchants such as a fluorocarbon plasma, although other etchants may alternatively be used. The etching process continues until the hardmask 301 is removed from those areas of the second sacrificial layer 203 that were located beneath the unexposed photoresist 303.

Once the hardmask 301 has been patterned to the desired shape, the remainder of the photoresist 303 may be removed using a suitable technique such as thermal ashing, thereby leaving only the hardmask 301 over the first sacrificial layer 201 and the second sacrificial layer 203. However, because the photoresist 303 has a thickness less than the combined thickness of the first sacrificial layer 201 and the second sacrificial layer 203, this removal may also alternatively be by-passed at this stage and the photoresist 303 may be removed in a process that patterns the first sacrificial layer 201 and the second sacrificial layer 203 (described below with respect to FIG. 4).

Figure 4:
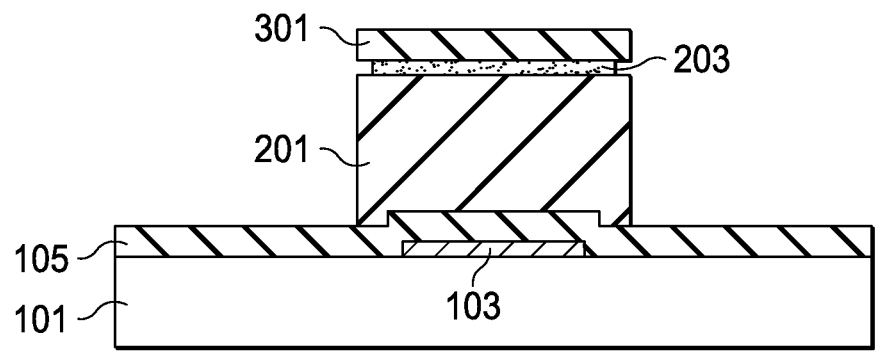
FIG. 4 illustrates the patterning of the sacrificial layers in accordance with an embodiment of the present invention.

FIG. 4 illustrates the patterning of the first sacrificial layer 201 and the second sacrificial layer 203 (and, optionally, the removal of the photoresist 303) using the hardmask 301 to protect those areas of the first sacrificial layer 201 and the second sacrificial layer 203 that are desired to be maintained. The first sacrificial layer 201 and the second sacrificial layer 203 may be etched utilizing an anisotropic plasma etch process using oxygen as the etchant. However, a oxygen plasma etch is not intended to be the sole method of etching the first sacrificial layer 201 and the second sacrificial layer 203. Other suitable etchants, such as $XeF_2$ or Cl based etchants, based at least in part on the precise materials chosen, and other methods of removal may alternatively be utilized to pattern the first sacrificial layer 201 and the second sacrificial layer 203 into the shape of the hardmask 301.

Additionally, if materials such as the materials cited above are used for the first sacrificial layer 201 (e.g., amorphous carbon) and the second sacrificial layer 203 (e.g., a BARC material), the oxygen plasma etch will undercut the second sacrificial layer 203, causing a step between the first sacrificial layer 201 and the second sacrificial layer 203 along the edge of the first sacrificial layer 201 and the second sacrificial layer 203. The second sacrificial layer 203 is undercut to form a step length of between about 1 nm and about 1 μm away from the edge of the first sacrificial layer 201, such as an undercut of between about 10 nm and about 30 nm.

Figure 5A:
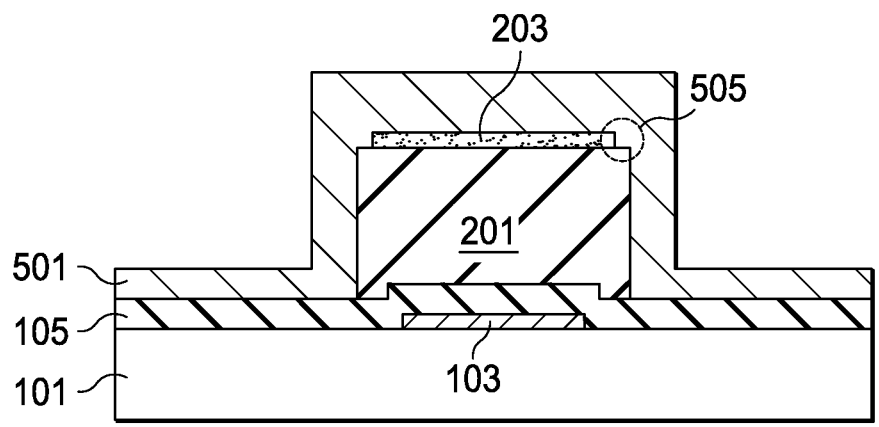
FIGS. 5A-5B illustrate a cross-sectional and a perspective view, respectively, of the formation of a variable capacitor top electrode layer in accordance with an embodiment of the present invention.
Figure 5B:
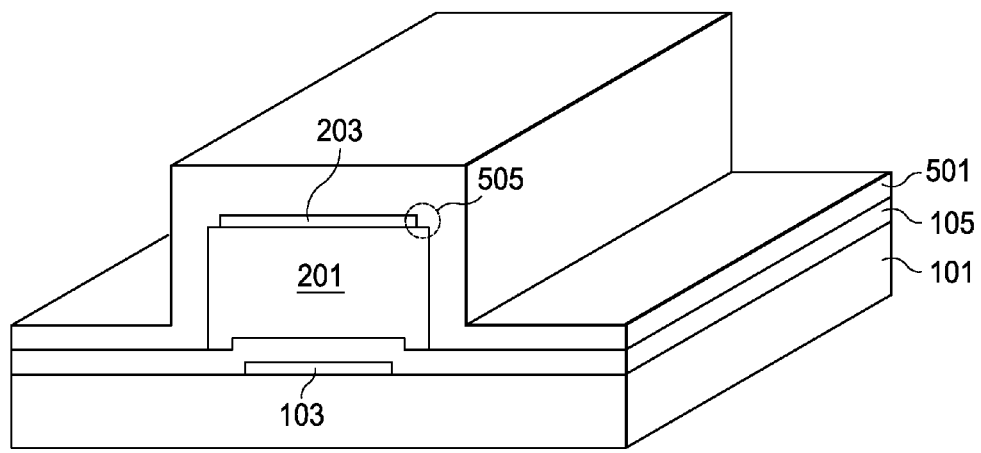

FIGS. 5A-5B illustrate a cross-sectional view and a perspective view, respectively, of the removal of the hardmask 301 from the second sacrificial layer 203 and the formation of a variable capacitor top electrode layer 501 over the first sacrificial layer 201 and the second sacrificial layer 203. The hardmask 301 may be removed in a single step using an etchant such as a fluorocarbon plasma, although other etchants and processes, such as a multi-step, multi-etch process, may alternatively be utilized.

The variable capacitor top electrode layer 501 may be formed as a blanket layer to cover the first sacrificial layer 201, the second sacrificial layer 203, and the dielectric layer 105. The variable capacitor top electrode layer 501 may comprise a similar material as the variable capacitor bottom plate 103, such as an aluminum copper alloy, titanium nitride, combinations of these, or the like. Further, the variable capacitor top electrode layer 501 may be formed using a deposition process such as PECVD to a thickness of between about 100 nm and about 30 μm, such as a thickness of about 5 μm. However, other processes and materials may alternatively be used.

Because the variable capacitor top electrode layer 501 is formed as a blanket layer over the first sacrificial layer 201 and the second sacrificial layer 203, the variable capacitor top electrode layer 501 will conform to the shape of the junction between the first sacrificial layer 201 and the second sacrificial layer 203. This shape will include the step-height between the first sacrificial layer 201 and the second sacrificial layer 203, forming an intermediate step junction 505 (circled in FIGS. 5A-5B with a dashed line) between a relatively vertical side of the variable capacitor top electrode layer 501 and a relatively horizontal side of the variable capacitor top electrode layer 501.

Figure 6:
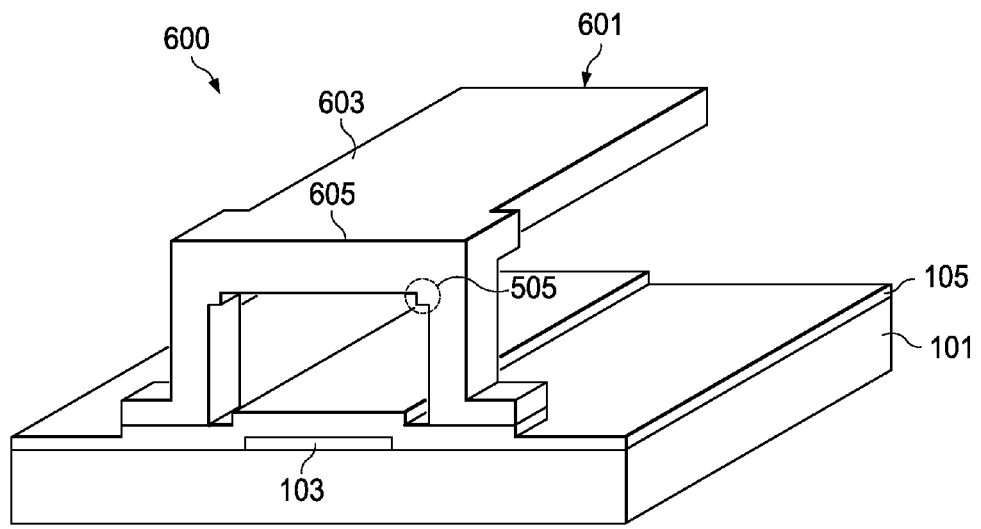
FIG. 6 illustrates the removal of the sacrificial layers in accordance with an embodiment of the present invention.

FIG. 6 illustrates a perspective view of a patterning of the variable capacitor top electrode layer 501 into a variable capacitor top electrode 601 and the removal of the first sacrificial layer 201 and the second sacrificial layer 203. The variable capacitor top electrode 601 may be patterned using a suitable masking and etching process so as to comprise a torsional hinge 605 and a plate region 603 extending away from the torsional hinge 605 over the variable capacitor bottom plate 103. The plate region 603 is designed to be able to rotate freely around the torsional hinge 605 when an electrostatic force is applied to it from an electrode (not shown) separate from the variable capacitor bottom plate 103 and the variable capacitor top electrode 601. The torsional hinge 605 provides support to the plate region 603 while still allowing the plate region 603 to move freely by having a portion connected to the dielectric layer 105 and additionally having a portion separated from the dielectric layer 105.

The first sacrificial layer 201 and the second sacrificial layer 203 are removed so as to free the plate region 603 of the variable capacitor top electrode 601 to rotate around the torsional hinge 605. This allows the variable capacitor 600 to have a first capacitance in a first, unactuated position, and a second capacitance in a second, actuated position. The first sacrificial layer 201 and the second sacrificial layer 203 may be removed using an ashing process or else a high selectivity etch using etchants such as oxygen plasma, $XeF_2$, or any suitable material specific solvent so as to remove the first sacrificial layer 201 and the second sacrificial layer 203 without substantially removing the variable capacitor top electrode 601 or the dielectric layer 105. The removal process is continued until the first sacrificial layer 201 and the second sacrificial layer 203 are completely removed, although multiple removal steps may alternatively be used to remove the first sacrificial layer 201 and the second sacrificial layer 203.

Although the present invention and its advantages have been described in detail, it should be understood that various changes, substitutions and alterations can be made herein without departing from the spirit and scope of the invention as defined by the appended claims. For example, many different materials and methods may be used to form and remove the first sacrificial layer and the second sacrificial layer. Further, different methods may be used to pattern the sacrificial layer into the desired shape.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for forming sacrificial layers, the method comprising:
    providing a substrate;
    forming a plurality of directly adjacent sacrificial layers over the substrate;
    patterning the plurality of sacrificial layers simultaneously such that a first sacrificial layer is removed in a first direction at a faster rate than a second sacrificial layer, wherein the difference in removal rates forms a step between the first sacrificial layer and the second sacrificial layer, wherein the first direction is parallel with a major surface of the substrate and wherein the step comprises a first sidewall of the first sacrificial layer and a second sidewall of the second sacrificial layer, the first sidewall being parallel to and laterally offset from the second sidewall, wherein the first sidewall and the second sidewall are perpendicular to a major surface of the substrate; and
    removing any remaining portion of the plurality of directly adjacent sacrificial layers.

2. The method of claim 1, wherein the patterning the plurality of sacrificial layers further comprises:
    forming a hardmask layer over the plurality of sacrificial layers;
    patterning the hardmask layer with a photoresist, wherein the photoresist has a thickness that is less than a combined thickness of the plurality of sacrificial layers.

3. The method of claim 1, further comprising forming a top electrode over the plurality of sacrificial layers prior to the removing any remaining portion of directly adjacent sacrificial layer.

4. The method of claim 3, wherein the forming a top electrode over the plurality of sacrificial layers further comprises:
    forming a blanket layer along the sidewalls and top of the plurality of sacrificial layers;
    patterning the blanket layer into a torsional hinge portion and a plate region.

5. The method of claim 4, further comprising performing a surface treatment to an uppermost one of the plurality of sacrificial layers prior to forming a blanket layer.

6. The method of claim 1, wherein the patterning the plurality of sacrificial layers is performed at least in part using an oxygen plasma.

7. The method of claim 1, wherein at least one of the plurality of sacrificial layers comprises amorphous carbon.

8. The method of claim 1, wherein at least one of the plurality of sacrificial layers comprises a bottom anti-reflective coating.

9. The method of claim 1, wherein the plurality of sacrificial layers comprises at least three sacrificial layers.

10. A method for forming a semiconductor device, the method comprising:
    providing a substrate;
    forming a first sacrificial layer over the substrate, the first sacrificial layer having a first thickness;
    forming a second sacrificial layer over the first sacrificial layer, the second sacrificial layer having a second thickness less than the first thickness;
    patterning the first sacrificial layer and the second sacrificial layer;
    forming a blanket layer over the first sacrificial layer and the second sacrificial layer;
    patterning the blanket layer such that at least a portion of the blanket layer remains over the second sacrificial layer; and
    removing the first sacrificial layer and the second sacrificial layer after the patterning the blanket layer.

11. The method of claim 10, further comprising forming a third sacrificial layer located between the first sacrificial layer and the substrate.

12. The method of claim 10, wherein the patterning the first sacrificial layer and the second sacrificial layer is performed at least in part using an oxygen plasma.

13. The method of claim 10, wherein the patterning the first sacrificial layer and the second sacrificial layer undercuts the second sacrificial layer more than the first sacrificial layer.

14. The method of claim 10, wherein the patterning the first sacrificial layer and the second sacrificial layer further comprises:
    forming a hardmask layer over the second sacrificial layer;
    forming a photoresist over the hardmask, wherein the photoresist has a thickness that is less than a combined thickness of the first sacrificial layer and the second sacrificial layer.

15. The method of claim 10, wherein the first sacrificial layer comprises amorphous carbon.

16. The method of claim 10, wherein the second sacrificial layer comprises a photoresist.

17. The method of claim 10, wherein patterning the blanket layer patterns the blanket layer into a top electrode of a variable capacitor.

18. A method of forming a variable capacitor, the method comprising:
    providing a substrate with a first electrode;
    forming a first sacrificial layer over the first electrode;
    forming a second sacrificial layer over the first sacrificial layer;
    patterning the first sacrificial layer and the second sacrificial layer, the patterning being performed at least in part through a process that removes the second sacrificial layer at a faster rate than the first sacrificial layer;
    forming a conductive layer over the second sacrificial layer;
    patterning the conductive layer into a second electrode by removing a first portion of the conductive layer without removing a second portion of the conductive layer, the second portion of the conductive layer located over the second sacrificial layer, wherein the first electrode is a first plate of the variable capacitor and the second electrode is a second plate of the variable capacitor; and
    removing the first sacrificial layer and the second sacrificial layer.

19. The method of claim 18, wherein the first sacrificial layer comprises amorphous carbon.

20. The method of claim 18, wherein the patterning the first sacrificial layer and the second sacrificial layer is performed at least in part using an oxygen plasma.

* * * * *